US007839318B2

(12) United States Patent
Wolf et al.

(10) Patent No.: US 7,839,318 B2
(45) Date of Patent: Nov. 23, 2010

(54) CURRENT MODE PIPELINED ANALOG-TO-DIGITAL CONVERTER

(75) Inventors: Thomas L. Wolf, Salt Lake City, UT (US); Rex K. Hales, Riverton, UT (US)

(73) Assignee: SiFlare, Inc, Sandy, UT (US)

( * ) Notice: Subject to any disclaimer, the term of this patent is extended or adjusted under 35 U.S.C. 154(b) by 0 days.

(21) Appl. No.: 11/941,672

(22) Filed: Nov. 16, 2007

(65) Prior Publication Data

US 2008/0117092 A1 May 22, 2008

Related U.S. Application Data

(60) Provisional application No. 60/859,741, filed on Nov. 17, 2006.

(51) Int. Cl.
H03M 1/44 (2006.01)
H03M 1/14 (2006.01)
(52) U.S. Cl. ...................................... 341/162; 341/156
(58) Field of Classification Search ................. 341/156, 341/158, 161, 162
See application file for complete search history.

(56) References Cited

U.S. PATENT DOCUMENTS

| 5,043,732 | A | | 8/1991 | Robertson et al. | |
|---|---|---|---|---|---|
| 5,327,129 | A | * | 7/1994 | Soenen et al. | ............... 341/120 |
| 5,990,820 | A | | 11/1999 | Tan et al. | |
| 6,313,780 | B1 | * | 11/2001 | Hughes et al. | ............... 341/156 |
| 6,462,695 | B1 | | 10/2002 | Ahuja et al. | |
| 2003/0076253 | A1 | | 4/2003 | Roovers et al. | |
| 2004/0001018 | A1 | * | 1/2004 | Hales | .......................... 341/155 |
| 2005/0242980 | A1 | * | 11/2005 | Collins et al. | ............... 341/155 |

FOREIGN PATENT DOCUMENTS

JP 09-232957 A 9/1997

OTHER PUBLICATIONS

Abed et al., High Speed Flash Analog-to-Digital Converter, IEEE 48th Midwest Symposium on Circuits and Systems, Aug. 2005, vol. 1, pp. 275-278.*
Agarwal et al., Low Power Current Mode ADC for CMOS Sensor IC, IEEE International Symposium on Circuits and Systems 2005, ISCAS 2005, May 2005, vol. 1, pp. 584-587.*
Carreira et al., A Compact Three-Step Pipelined CMOS Current-Mode A/D Converter, 1997 IEEE International Symposium on Circuits and Systems, ISCAS'97, Jun. 1997, vol. 1, pp. 465-568.*
Li et al., The Application of Current-mode Circuits in the Design of an A/D Converter, IEEE Canadian Conference on Electrical and Computer Engineering, May 1998, vol. 1 pp. 41-44.*

(Continued)

*Primary Examiner*—Howard Williams
(74) *Attorney, Agent, or Firm*—Steven L. Nichols; VanCott, Bagley, Cornwall & McCarthy P.C.

(57) ABSTRACT

A pipelined analog-to-digital converter includes a plurality of stages each including a sample-and-hold circuit configured to output an analog signal having a current and a current mode analog-to-digital converter configured to compare the current of the analog signal output by the sample-and-hold circuit to current generated by a plurality of current sources and output a digital representation of the analog signal.

24 Claims, 7 Drawing Sheets

OTHER PUBLICATIONS

Jonsson, A 3 V, 10 bit, 6.4 MHz Switched-Current CMOS A/D Converter Design, 1998 IEEE International Conference on Electronics, Circuits and Systems, Sep. 1998, vol. 1 pp. 27-30.*

Chung-Yu Wu et al., A CMOS Transistor-Only 8-B 4.5-Ms/S Pipelined Analog-To-Digital Converter Using Fully-Differential Current-Mode Circuit Techniques; IEEE Journal of Solid State Circuits, vol. 30, No. 5; May 1995, pp. 522-532.*

Toumazou et al.; Switched-currents: an analogue technique for digital technology; Institution of Engineering and Technology (IET); 1990; Nairn, Chapt. 12, pp. 304-309.*

* cited by examiner

CURRENT MODE PIPELINED ANALOG-TO-DIGITAL CONVERTER

RELATED APPLICATIONS

The present application claims priority under 35 U.S.C. §119(e) to U.S. Provisional Patent Application No. 60/859,741, by Thomas L. Wolf et al., filed on Nov. 17, 2006, and entitled "PIPELINED ANALOG-TO-DIGITAL CONVERTER," the contents of which are hereby incorporated by reference in their entirety.

BACKGROUND

Historically, engineers have been trained to design circuits in terms of voltage. For example, when performing integrated circuit analysis, designers typically focus on the voltage change at the output of the circuit that occurs as a result of a voltage change that occurs from the input of the circuit. Circuit simulators also follow this approach by constructing matrices of nodes to solve for node voltages. On the test bench, voltage sources are used to operate circuits under test and test equipment is configured to measure voltage.

Over the years, the density of integrated circuits has increased rapidly as component sizes have become smaller. With each reduction in component size, a corresponding reduction in optimal operating voltages occurs. These decreases in operating voltages have required reductions in threshold voltages in order to maintain desired noise margins. Analog circuits, particularly analog-to-digital converters (ADCS) have suffered from this reduction, as they are typically designed with higher voltage transistors and operating voltages than are available to digital designers.

In a typical voltage mode ADC, the voltage being sampled is stored on a capacitor. It can be shown that the minimum size of the capacitor storing the voltage must be $>kT/(V_n^2)$, where k is Boltzman's constant, T is temperature in Kelvin, and Vn is the size of the largest noise signal, usually less than ¼ of the ADC's least significant bit (LSB), that can be tolerated to give a low probability of error. As the operating voltage is reduced due to newer processes, the minimum capacitor size increases. This increases both the size of the circuit and the power used.

The accuracy of a voltage mode circuit, including a voltage mode ADC, is determined by the size of the capacitance used to store the voltage. The speed and power consumption of a voltage mode circuit is consequently affected by circuit capacitance and parasitic capacitance. The nodes of a voltage mode circuit must change voltage during operation of the circuit over a range that is often approximately the entire voltage range of the power supply voltage. Changing to a smaller geometry process increases parasitic capacitances, and due to the smaller voltage swing, larger circuit capacitances must be used, thereby requiring more power to compensate for the reduction in noise margins.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

A pipelined analog-to-digital converter includes a plurality of stages each including (1) a sample-and-hold circuit configured to output an analog signal having a current and (2) a current mode analog-to-digital converter configured to compare the current of the analog signal output by the sample-and-hold circuit to current generated by a plurality of reference current sources and output a digital representation of the analog signal. The sample-and-hold circuit also generates an analog signal current that is subtracted from an analog signal recreated by a digital-to-analog converter to create a residual signal that may or may not be amplified and used as an input to the next stage.

Exemplary methods of converting an input analog signal into a digital signal include inputting the input analog signal into a sample-and-hold circuit of a first stage, generating an analog signal having a current with the sample-and-hold circuit, generating a digital representation of the analog signal generated by the sample-and-hold circuit with a current-mode analog-to-digital converter, generating an analog signal representing the digital representation with a digital-to-analog converter, and generating a residue signal that is input into a sample-and-hold circuit of a second stage by subtracting the analog signal generated by the digital-to-analog converter from the analog signal generated by the first stage sample-and-hold circuit.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

The present specification describes, among other things, exemplary current mode pipelined analog-to-digital converters (ADCs). As will be described in more detail below, the use of pipelined current mode ADCs is advantageous in many systems and often results in reduced power consumption, fewer components, lower cost, faster operating speeds, simplified layout, and higher accuracy.

In some examples, as will be described in more detail below, a current mode ADC operates, for example, by comparing the current of an input signal to one or more reference currents to create a digital representation of the incoming signal. The ADC described herein may be used in a variety of applications including but not limited to, battery level measurement (metering), communications, imaging, measurement, control systems, sensors, etc.

As described above, traditional circuits are designed in terms of voltage. For example, in the field of analog-to-digital conversion, voltage mode ADCs compare the voltage of an input signal to a number of reference voltages to determine which reference voltage is closest to the voltage of the input signal. A digital representation of the input signal may then be created based on a series of such voltage comparisons.

In contrast, there are several advantages to designing circuits in terms of current. As will be described in more detail below, in current mode ADCs, for example, the current of an input signal may be compared to a plurality of current references to determine which reference current is closest to the current of the input signal. A digital representation of the input signal may then be created based on a series of such current comparisons.

One of the many advantages of this approach is that, because current sources are used instead of voltage references, operational voltage becomes far less of a limiting factor to circuit design. By allowing lower operating voltages to be used, the ADC can take better advantage of the increases in modern integrated circuit density. Also, since the voltages at nodes in a current mode circuit change very little, circuit and parasitic capacitances have much less effect on the speed of the circuit.

Figure 1:
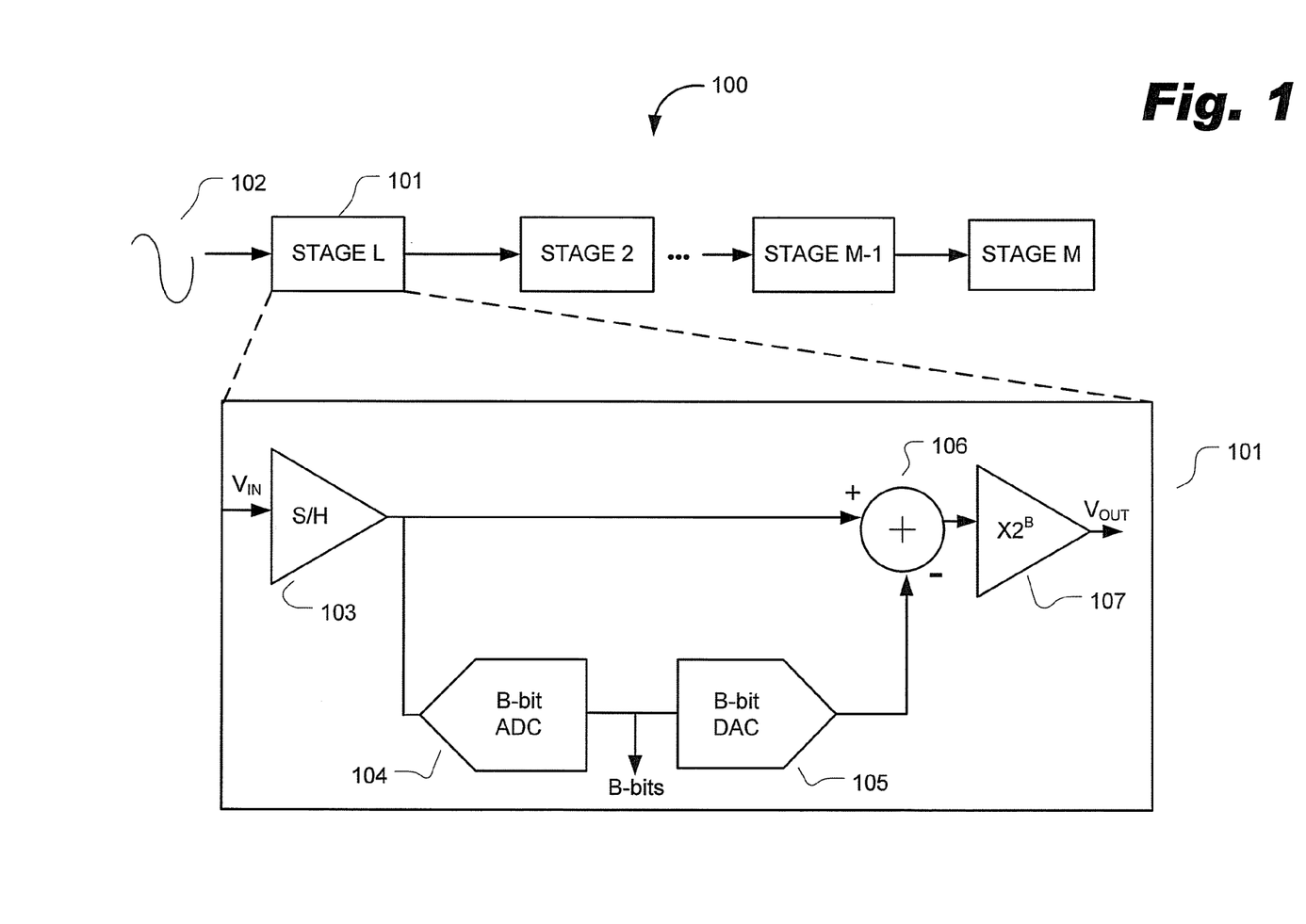
FIG. 1 illustrates an exemplary voltage mode pipelined analog-to-digital converter (ADC) according to principles described herein.

FIG. 1 illustrates an exemplary voltage mode pipelined ADC (100). As shown in FIG. 1, the pipelined ADC (100) includes a number of stages (101) through which an analog signal (102) is passed to produce a digital approximation of that analog signal. Each stage (101) may include a sample and hold circuit (S/H) (103), a B-bit ADC (104), a B-bit DAC (105), a summing block (106), and an amplifier (107). As will be appreciated by those skilled in the art, the pipelined ADC (100) can be either singled ended or differential. FIG. 1 is intended to be generic to either case. Consequently, each of the signal lines shown in FIG. 1 can be interpreted as either a single signal line or a pair of differential signal lines.

In some examples, as shown in FIG. 1, the analog input signal (102) is first sampled by the S/H circuit (103). As shown in FIG. 1, the S/H circuit (103) is voltage-based. The output of the S/H circuit (103) is then input into a B-bit ADC (104), which outputs a digital signal. The output of the ADC (104) is converted into an analog signal by a B-bit DAC (105). The summing block (106) subtract the output of the DAC (105) from the output of the S/H circuit (103). The result of this subtraction is referred to as a residue signal. The residue signal is often very small and therefore has to be amplified by an amplifier (107) before being input into a subsequent stage. The process is repeated in each stage and the digital outputs of the B-bit ADCs (104) within each stage may be combined to achieve a desired resolution.

However, the voltage mode pipelined ADC (100) of FIG. 1 has many inherent disadvantages. For example, because the amplitude of the residue signal output by each summing block (106) is so small, the residue signal has to be amplified by $2^B$, or often $2^{(B-1)}$ if error correction is used, by an amplifier (107) prior to being input into a subsequent stage. The use of the amplifiers (107) may introduce inaccuracies, have bandwidth limitations, be costly, occupy valuable chip space, and consume undesirable amounts of power. A number of additional disadvantages may also exist.

Hence, a number of exemplary current mode pipelined ADC architectures will be described herein. For example, FIG. 2 illustrates an exemplary current mode pipelined ADC architecture (120) that may be used in accordance with the systems and methods described herein.

Figure 2:
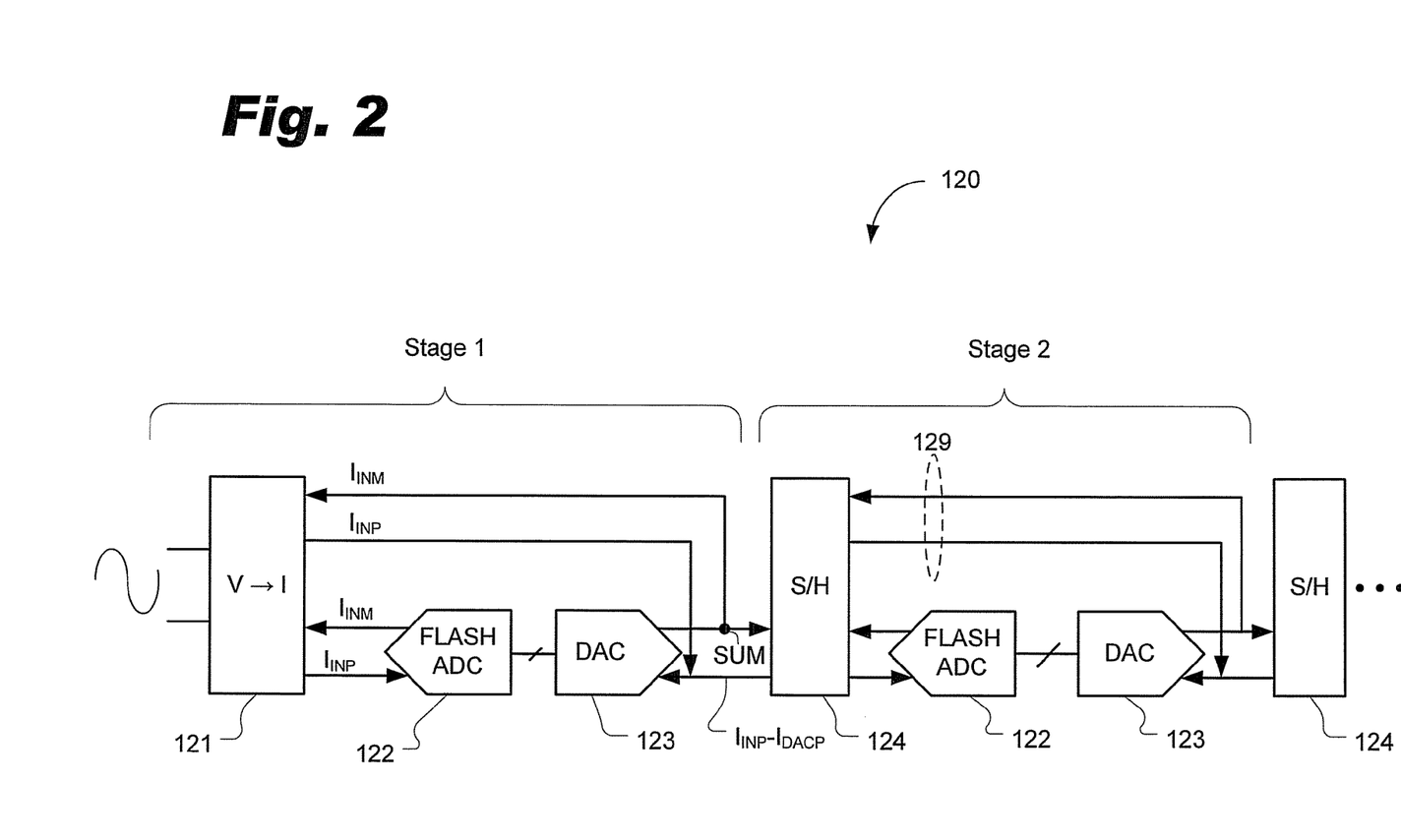
FIG. 2 illustrates an exemplary current mode pipelined ADC architecture according to principles described herein.

As shown in FIG. 2, the current mode pipelined ADC (120) includes a number of stages. The example shown in FIG. 2 is a differential example with paired differential signal lines between components. However, it will be appreciated by those skilled in the art that the ADC (120) of FIG. 2 may alternatively be single ended. In the illustrated example, the first stage includes a voltage-to-current converter (121), a current mode flash ADC (122) and a (DAC) 123. Each of the remaining stages includes a S/H circuit (124), a current mode flash ADC (122), and a DAC (123). Each of these components will be described in more detail below.

An analog input signal is first input into the voltage-to-current converter (121), which converts the input signal from voltage to current. It will be recognized that in some instances, the signal is already represented in terms of current and therefore does not have to be converted by a voltage-to-current converter (121). In such instances, the voltage-to-current converter (121) may be omitted entirely.

The voltage-to-current converter (121) may also be configured to function as a sample and hold circuit. In other words, the voltage-to-current converter (121) may be configured to sample the analog input signal and hold the value until it has been processed by the first stage. In some examples, the sample and hold function may be performed by an additional component placed in series behind the voltage-to-current converter (121).

The output signals of the voltage-to-current converter (121) are then input into a current mode flash ADC (122). As shown in FIG. 2, the voltage-to-current converter (121) produces two copies of paired, differential currents ($I_{INM}$ and $I_{INP}$). The differential pair between the voltage-to-current converter (121) and the flash ADC (122) may be scaled, e.g., scaled down. This respect to the sample-and-hold (S/H) circuit (124) in the second stage (Stage 2), the differential pair of current signals between that S/H circuit (124) and the flash ADC (122) of the second stage (Stage 2) are also scaled down from the paired current signals between the first stage (Stage 1) and (Stage 2). However, the third pair of current signals (129) used by the S/H circuit (124) of the second stage (Stage 2) are an exact copy of the paired current signals between the first stage (Stage 1) and (Stage 2).

Figure 3:
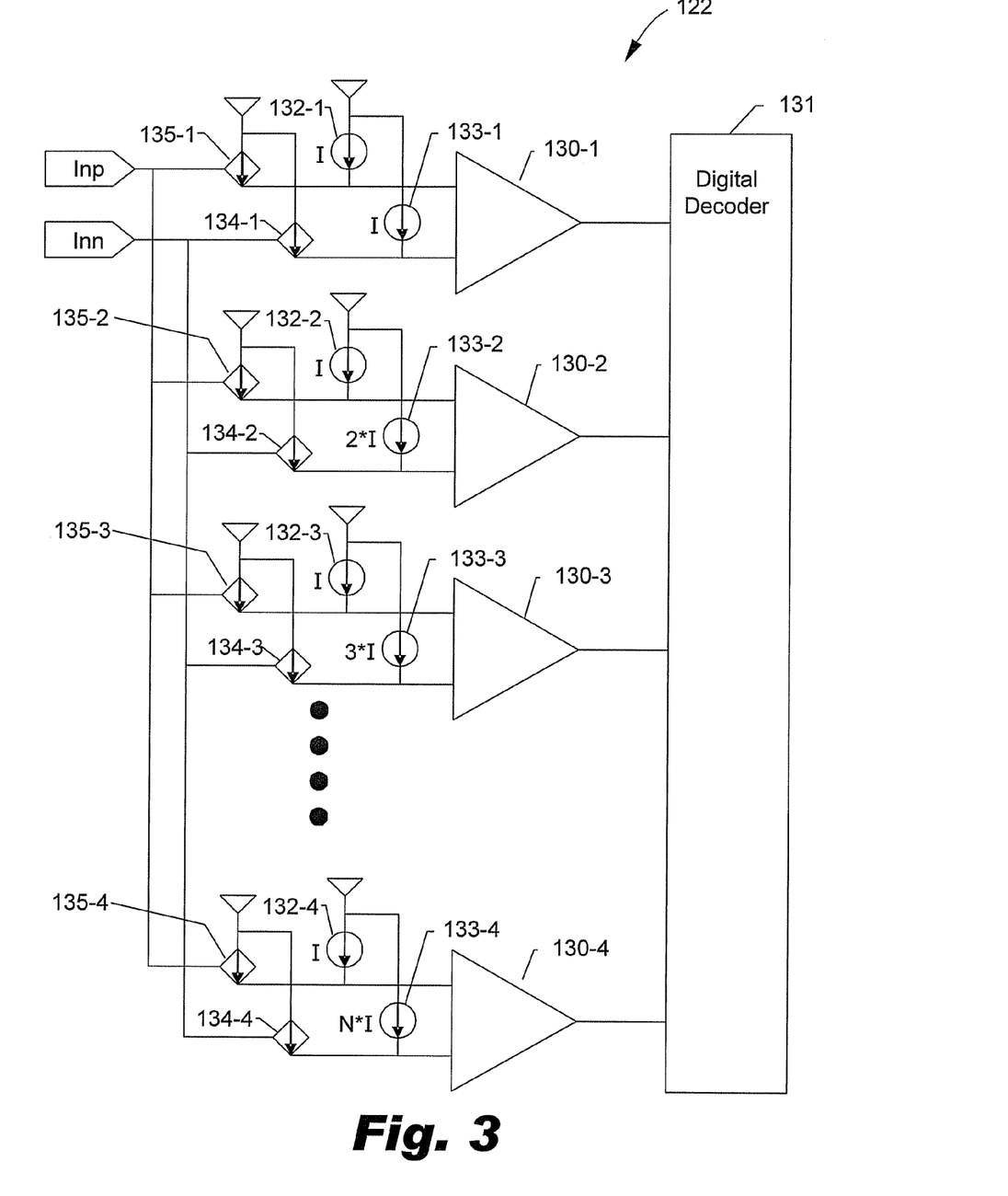
FIG. 3 shows an exemplary n-bit current mode ADC that may be used within the current mode pipelined ADC according to principles described herein.

FIG. 3 shows an exemplary n-bit current mode ADC (122) that may be used within the current mode pipelined ADC (120). As shown in FIG. 3, current comparators (e.g., 130-1 through 130-4, collectively referred to herein as 130) are connected to a digital decoder (131). The comparators (130) each receive current inputs and convert them to a number of digital outputs. Elements 132-1 through 132-4 (collectively referred to herein as 132) are current sources that are configured to add a DC bias to each input signal. Elements 133-1 through 133-4 (collectively referred to herein as 133) are current sources with output currents scaled from I to N*I, where N is equal to $2^n$. Because the inputs to the comparators 130 are currents, elements 135-1 through 135-4 and 134-1 through 134-4 are current controlled current sources having current equal to, or scaled versions of, input currents Inp and Inn respectively, to allow for combining the currents into the comparators.

Each of the current comparators (130) shown in FIG. 3 may include any combination of circuitry as may serve a particular application. For example, each current comparator (130) may include a sense amplifier. Sense amplifiers compare current values differentially, thereby avoiding problems with parasitic capacitances on the bit lines. Current differences can be detected accurately at relatively high speeds without the need to wait for the voltages to slew to final values, the timing of which is relatively sensitive to parasitic capacitance. Additionally or alternatively, the current comparator may include any other type of current comparator as may serve a particular application.

Figure 4:
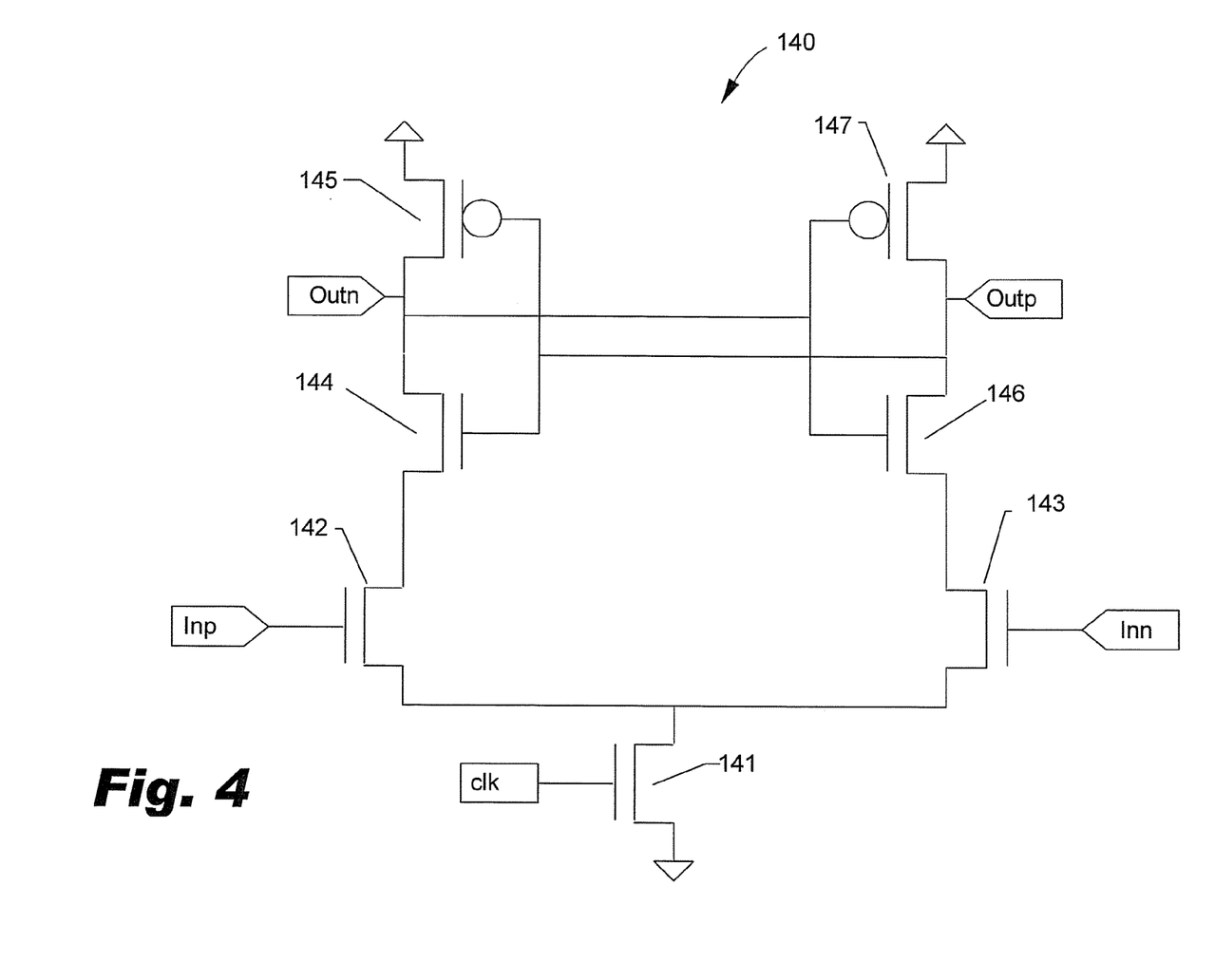
FIG. 4 illustrates an exemplary sense amplifier comparator that may be used as one or more of the current comparators shown in FIG. 3 according to principles described herein.

FIG. 4 illustrates an exemplary sense amplifier comparator (140) that may be used as one or more of the current comparators (130) shown in FIG. 3. The comparator (140) is configured to be able to detect very small voltage changes on the two input nodes Inp and Inn. In some examples, the Inp and Inn nodes are charged to the supply voltage while a clock input is held low. When the clock input goes high, the voltage at Inp or Inn starts to change as components discharge the capacitance of the Inp or Inn signal. At the same time, NMOS transistor (141) turns on and causes a current to start flowing in transistors (142) and (143). This current is proportional to the voltage at the gates of transistors (142) and (143). NMOS transistor (144) and NMOS transistor (145) together form an inverter with the Outn as the output and Outp as the input. As will be appreciated by those skilled in the art, Outp is a voltage. NMOS transistor (146) and NMOS transistor (147) form an inverter with Outp as the output Outn as the input. These transistors provide positive feedback that gives the circuit much higher gain than just the gain of the differential pair formed by transistors (142) and (143).

Figure 5:
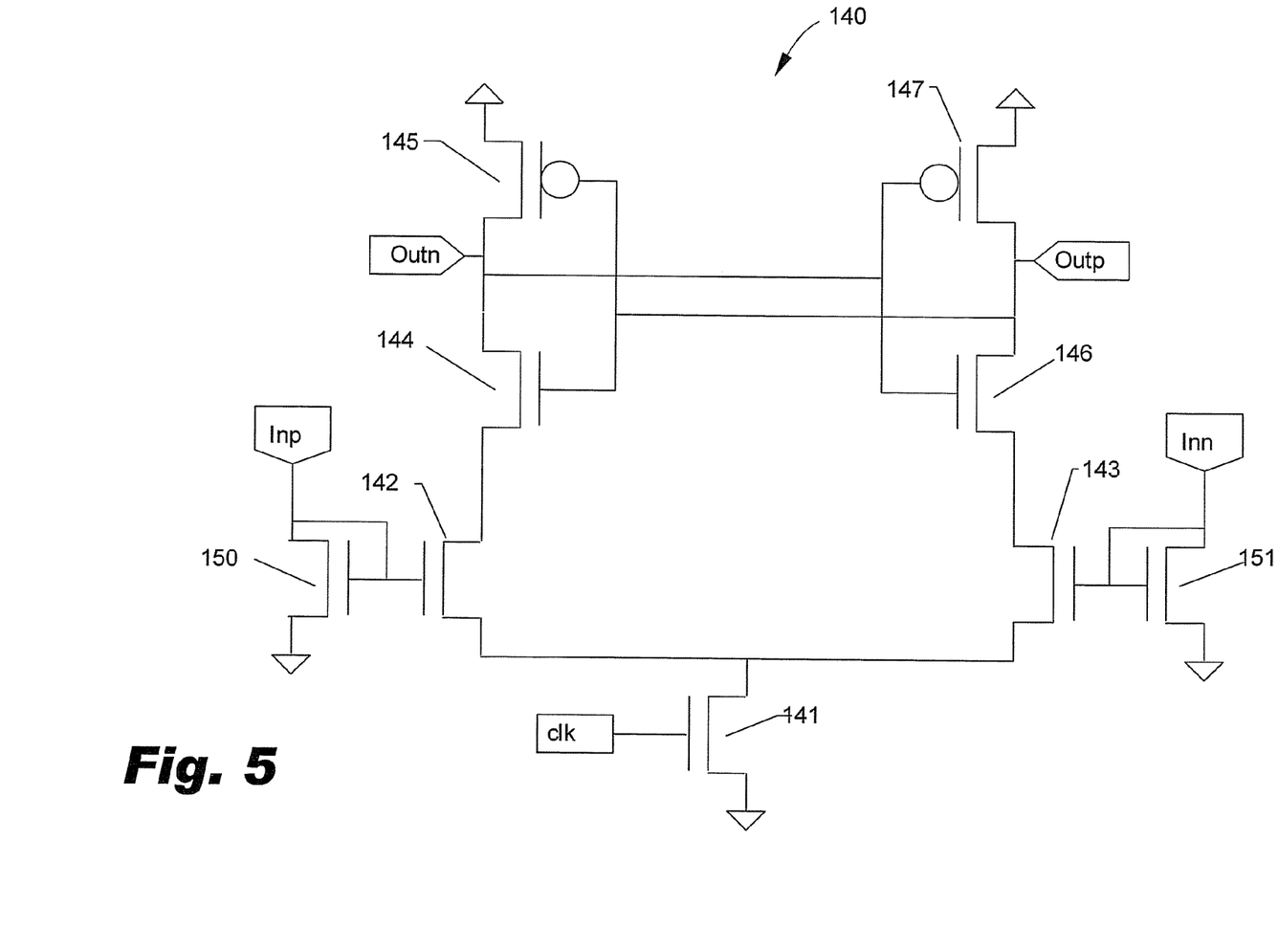
FIG. 5 shows a modification of the sense amp of FIG. 4 which gives a simple current mirror input to the sense amp comparator according to principles described herein.

FIG. 5 shows a modification of the sense amp of FIG. 4 which gives a simple current mirror input to the sense amp comparator (140). NMOS transistors (150) and (151) have been added to the configuration shown in FIG. 4 to form a current mirror configuration. When the clock input is high, the current in transistor (142) will be the same as transistor (150) because both transistors have the same gate voltage and nearly the same drain voltage as the drain voltage of transistor (142) is pulled close to ground by NMOS transistor (143). Likewise, the current in transistor (143) will be the same as transistor (151).

It will be recognized that the current mode flash ADC (122) illustrated in FIGS. 3-5 is merely exemplary of the many types of different current mode ADCs (122) that may be used in accordance with the systems and methods described herein.

Returning to FIG. 2, the digital output of the current mode flash ADC (122) is input into a DAC (123), which converts the digital signal into an analog signal (IDAC). The amplitude of IDAC is typically very small, e.g., around 400 microamps. However, it will be recognized that the amplitude of IDAC may have any value as may serve a particular application.

Figure 6:
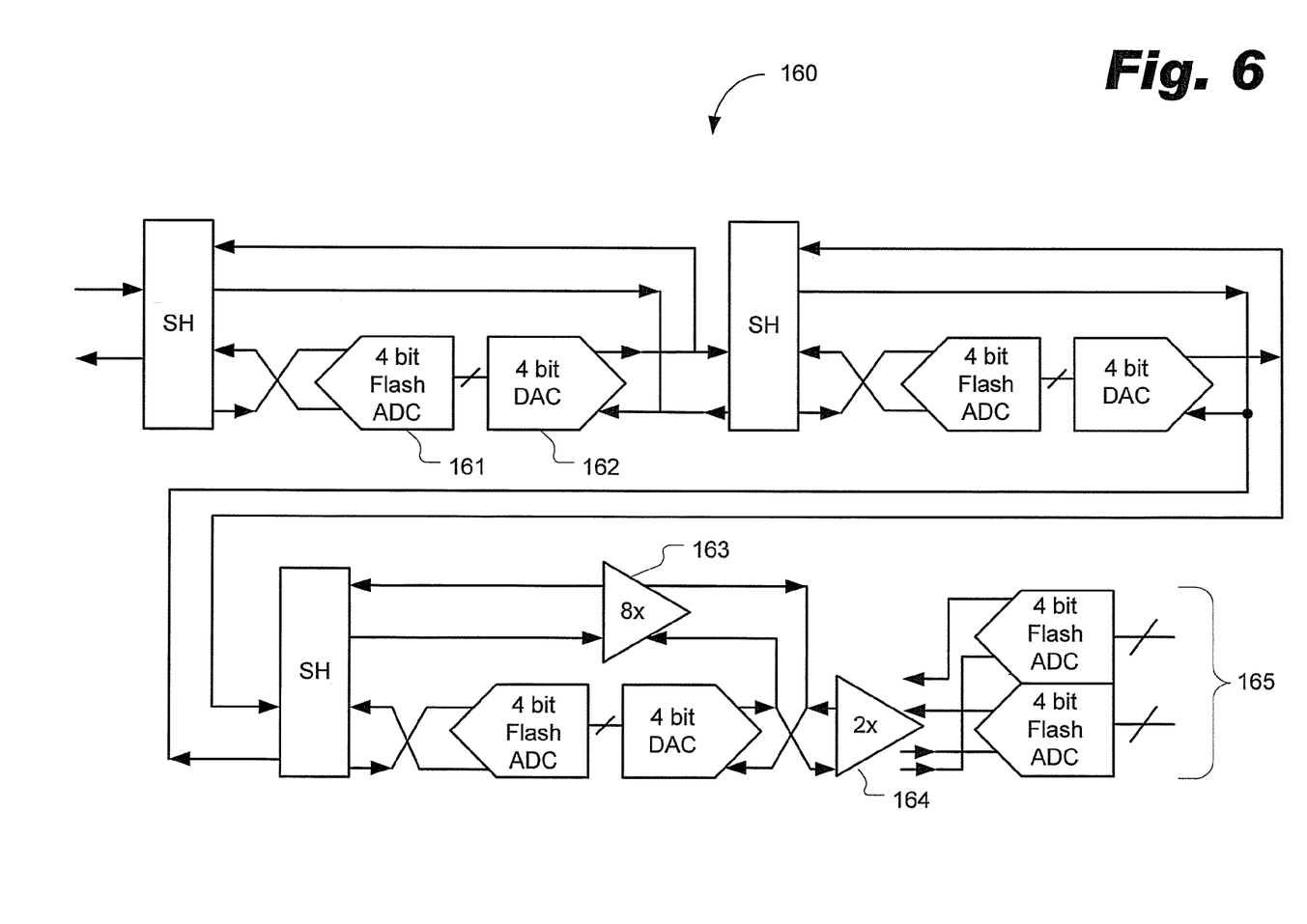
FIG. 6 illustrates an exemplary current mode pipelined ADC wherein the components are each four bits according to principles described herein.

Because the output signal of the DAC (123) is in terms of current, it can be subtracted directly from the output signal of the voltage-to-current converter (121) without the need for a summing block simply by electrically connecting the output of the DAC (123) to the output of the voltage-to-current converter (121). Consequently, the signals are summed at a node (e.g., SUM) shown in FIG. 2 before being input to a sample and hold (S/H) circuit (124). This subtraction results in a residue current signal having a current equal to $I_{INP}-I_{DACP}$ that is input into a sample and hold (S/H) circuit (124) of the next stage. It should be noted that the circuits can also be designed such that $I_{DACP}$ is larger than $I_{INP}$ resulting in a residue current signal equal to $I_{DACP}-I_{INP}$. In such cases, the lines between the S/H and the flash ADC may be crossed, as shown in FIG. 6.

In some examples, because the flash ADCs (122) in the pipelined ADC (120) are current mode ADCs, no amplification of the residual current is needed prior to being input into the S/H circuit (124) of the next stage. This is because the current mode ADCs (122) may be configured to be able to process very low amplitude signals. Hence, the current mode pipelined ADC (120) is advantageous in many applications.

The current mode pipelined ADC (120) shown in FIG. 2 may include any number of bits of resolution and/or stages. For example, FIG. 6 illustrates an exemplary current mode pipelined ADC (160), where the components are each four bits. As shown in FIG. 6, each stage of the current mode pipelined ADC (160) includes a 4-bit flash ADC (161) and a 4-bit DAC (162) for illustrative purposes. It will be recognized that the flash ADC (161) and DAC (162) may have any number of bits as best serves a particular application.

Rather than scaling the residual signal coming out of each summing function back to its original value, the current is allowed to scale down by a factor of 8 (or any other suitable factor) in each stage. In some embodiments, the current may be scaled up by 8 (or any other suitable factor) for convenience, for example, using amplifier (163) in the last stage. However, it will be recognized that the current does not have to be amplified in the last stage in some alternative embodiments.

As further shown in FIG. 6, one or more additional amplifiers (e.g., amplifier 164) and one or more additional ADCs (165) may be included after all of the stages. These components may be added to adjust the number of bits of resolution of the pipelined ADC (160). For example, with the 2× amplifier (164) and the two current mode 4-bit flash ADCs (165), the references of the ADCs (165) may be adjusted slightly to effectively result in a 5-bit pipelined current mode ADC (160).

In some examples, one or more of the components within the pipelined current-mode ADC (120) described herein may be tested to ensure proper functionality. It is often difficult to determine if variations or defects from manufacturing in the individual flash ADC or DAC blocks have caused the overall performance of the pipelined ADC to be degraded.

Figure 7:
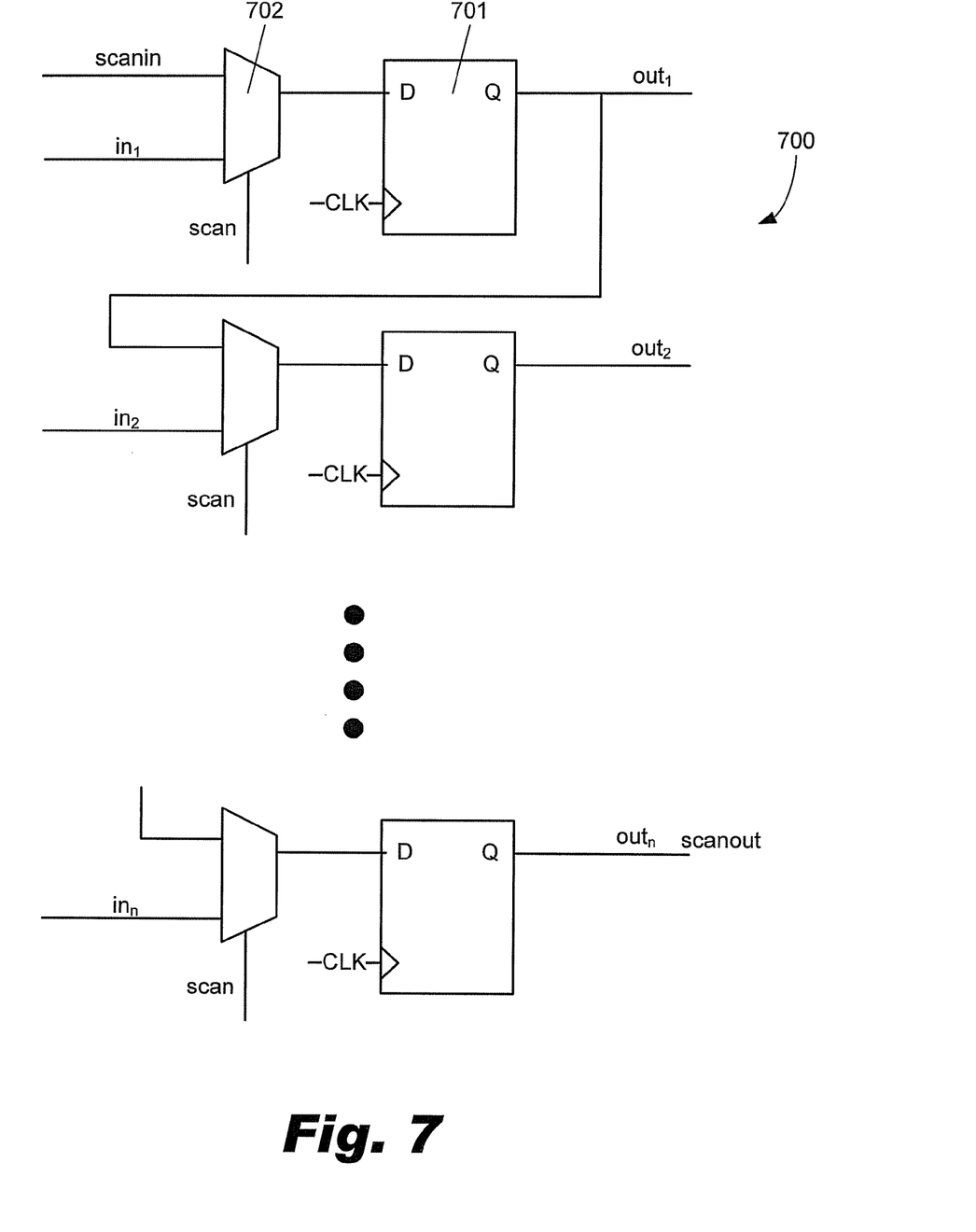
FIG. 7 illustrates an exemplary scan chain for testing digital circuitry according to principles described herein.

Referring now to FIG. 7, a common technique for testing digital circuitry is called a scan chain (700). The scan chain (700) is composed of a series of flip flops (e.g., 701) Each of the flip flops (701) is connected to a multiplexer circuit (e.g., 702) that allows the series of flip flops (701) to be configured into a serial shift register when the "scan" signal is asserted as illustrated in FIG. 7. This allows the contents of all the flip flops (701) to be clocked out serially on the "scanout" signal line. Alternatively, the flip flops (701) can be loaded by clocking in a pattern presented to the "scanin" signal.

Referring additionally to FIG. 2, the digital output of the flash ADC (122) is normally held in a register for input into the following DAC (123) within each stage in the pipelined ADC (120). If the scan chain (700) acting as a serial shift register has the multiplexer circuitry (702) as shown in FIG. 7, the stage (FIG. 2) of the ADC (120) can be tested by scanning values into and out of this intermediate register (700, FIG. 7) to evaluate what the result of the flash ADC conversion was, as well as change the output of the DAC by scanning in a new digital value for the DAC to convert to analog. This may utilize multiplexers connected the scan chain (700) to the input and output of the ADC (122) and the DACs (123) in the pipelined converter (120).

For example, the scan chain (700) may receive the output of an ADC (122) to allow a determination whether the code coming out of the ADC (122) is correct given the corresponding input. If so, the ADC (122) is functioning correctly. A code may be input from the scan chain (700) to a DAC (123) so that the DAC's output can be used by the next ADC in a subsequent stage to determine if the next ADC is functioning correctly. Additionally, after the code is input to the DAC, the code's analog value output by the DAC to a downstream sample and hold circuit (124) can be checked to determine if the DAC is functioning correctly.

For example, the flash ADC (122, FIG. 2) within each stage may be tested by inputting a test signal into the voltage-to-current converter (121) and scanning out the resulting answers from one or more of the flash ADCs (122). In some examples, the scan clock (CLK, FIG. 7) is separate from the sample and hold clock. Testing the flash ADC (122) in this manner may also effectively test an entire stage corresponding to the flash ADC (122). Hence, in the example given in FIG. 2, by inserting a scanning register (700) in between the flash ADC (122) and DAC (123), the entire first stage of the pipelined current mode ADC (120) may be tested.

Additionally or alternatively, the pipelined ADC (120) may be tested by loading a value onto one or more of the DACs (123) independent of what each of the ADCs (122) are doing. In this manner, an analog signal output from a DAC (123) may be analyzed to verify functionality thereof. In some examples, the analog output signal from the DAC (123) may be accessed by one or more test devices by providing a third replica of the outputs from the DAC's corresponding sample and hold circuit (124).

Additionally or alternatively, once one of the DACs (123) is determined to function properly, it can be used to test one or more of the ADCs (122) within any of the stages. For example, if the first stage DAC (123) is tested and found to function properly, its output may be input into the first stage ADC (122) or any other ADC within any other stage to test functionality thereof. Thus, if it is determined that an ADC is functioning correctly, a multiplexer can be used to rout the signal from any of the DACs to that ADC so that any of the DACs can be tested using the ADC that is known to work.

Likewise, once one of the ADCs (122) is determined to function properly, it can be used to test one or more of the DACs (123) within any of the stages. For example, if the first stage ADC (122) is tested and found to function properly, its output may be input into the first stage DAC (123) or any other DAC within any other stage to test functionality thereof. Thus, it if is determined that a DAC is functioning correctly, the output of that DAC can be routed with a multiplexer to the input of an ADC under test to test the functionality of that ADC.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A pipelined analog-to-digital converter, comprising:
a plurality of stages at least one of said stages comprising:
a sample-and-hold circuit configured to output an analog signal having a current; and
a current mode analog-to-digital converter configured to output a digital representation of said analog signal;
a digital-to-analog converter configured to receive said digital representation and output an analog signal representing said digital representation;
wherein said stages are configured such that said analog signal from said digital-to-analog converter in at least one of said stages is combined with said analog signal from said sample-and-hold circuit to form a residue current, said residue current being input to a subsequent stage without amplification in at least one of said plurality of stages and with amplification before input into at least one of said plurality of stages.

2. The pipelined analog-to-digital converter of claim 1, wherein at least one of said stages is further configured to generate a residue signal that is input into a subsequent stage by subtracting said analog signal output by said digital-to-analog converter from said analog signal output by said sample-and-hold circuit without a summing block by direct electrical connection of the output of the digital-to-analog converter to the output of the sample-and-hold circuit.

3. The pipelined analog-to-digital converter of claim 1, wherein said current-mode analog-to-digital converter comprises a flash analog-to-digital converter.

4. The pipelined analog-to-digital converter of claim 3, wherein said flash analog-to-digital converter is configured to output n bits of resolution, in which n is larger than 1.

5. The pipelined analog-to-digital converter of claim 1, further comprising at least one additional current mode analog-to-digital converter in series after said plurality of stages.

6. The pipelined analog-to-digital converter of claim 1, wherein said sample-and-hold circuit of a first stage of said plurality of stages is further configured to convert an input analog signal from voltage to current.

7. The pipelined analog-to-digital converter of claim 1, wherein said sample-and hold circuit of at least one said stage comprises a voltage-to-current converter.

8. The pipelined analog-to-digital converter of claim 1, wherein said sample-and-hold circuit is a differential circuit configured to output a pair of output signals.

9. A pipelined analog-to-digital converter, comprising:
a plurality of stages, wherein at least one of said stages comprises
a sample-and-hold circuit configured to output an analog signal having a current;
a current mode analog-to-digital converter configured to output a digital representation of said analog signal; and
a digital-to-analog converter configured to receive said digital representation and output an analog signal representing said digital representation; and
wherein at least one of said stages is further configured to generate a residue signal that is input into a subsequent stage by subtracting said analog signal output by said digital-to-analog converter from said analog signal output by said sample-and-hold circuit without a summing block by direct electrical connection of the output of the digital-to-analog converter to the output of the sample-and-hold circuit, said residue signal being amplified before input into at least one of said plurality of stages and not being amplified before input into at least one of said plurality of stages.

10. The pipelined analog-to-digital converter of claim 9, wherein said current-mode analog-to-digital converter comprises a flash analog-to-digital converter.

11. The pipelined analog-to-digital converter of claim 10, wherein said flash analog-to-digital converter is configured to output four bits of resolution.

12. The pipelined analog-to-digital converter of claim 9, further comprising at least one amplifier configured to amplify said analog signal generated by said sample-and-hold circuit.

13. The pipelined analog-to-digital converter of claim 9, further comprising at least one additional current mode analog-to-digital converter in series after said plurality of stages.

14. The pipelined analog-to-digital converter of claim 9, wherein said sample-and-hold circuit of a first stage of said plurality of stages is further configured to convert an input analog signal from voltage to current.

15. The pipelined analog-to-digital converter of claim 9, wherein said sample-and hold circuit of at least one said stage comprises a voltage-to-current converter.

16. The pipelined analog-to-digital converter of claim 9, wherein said sample-and-hold circuit is a differential circuit configured to output a pair of output signals.

17. A pipelined analog-to-digital converter, comprising:
a plurality of stages, at least one of said stages comprising:
a sample-and-hold circuit configured to output an analog signal having a current; and
a current mode analog-to-digital converter configured to output a digital representation of said analog signal;
a digital-to-analog converter configured to receive said digital representation and output an analog signal representing said digital representation;
two N-bit analog-to-digital converters connected to an output to said plurality of stages, wherein reference currents input to said two N-bit analog-to-digital converters are adjusted such that said two N-bit analog-to-digital converters output a N+1-bit digital signal;
wherein said stages are configured such that said analog signal from said digital-to-analog converter in at least one of said stages is input to said current mode analog-to-digital converter in a subsequent stage without amplification.

18. A pipelined analog-to-digital converter, comprising:
a plurality of stages, at least one of said stages comprising:
a sample-and-hold circuit configured to output an analog signal having a current; and
a current mode analog-to-digital converter configured to output a digital representation of said analog signal;
a digital-to-analog converter configured to receive said digital representation and output an analog signal representing said digital representation;
at least one scan register coupled to said current mode analog-to-digital converter and to said digital-to-analog converter and configured to scan out digital data in response to a test signal;
wherein said stages are configured such that said analog signal from said digital-to-analog converter in at least one of said stages is input to said current mode analog-to-digital converter in a subsequent stage without amplification.

19. A pipelined analog-to-digital converter, comprising:
a plurality of stages, wherein at least one of said stages comprises
a sample-and-hold circuit configured to output an analog signal having a current;
a current mode analog-to-digital converter configured to output a digital representation of said analog signal; and
a digital-to-analog converter configured to receive said digital representation and output an analog signal representing said digital representation;
at least one scan register coupled to said current mode analog-to-digital converter and to said digital-to-analog converter and configured to scan out digital data in response to a test signal; and
wherein at least one of said stages is further configured to generate a residue signal that is input into a subsequent stage by subtracting said analog signal output by said digital-to-analog converter from said analog signal output by said sample-and-hold circuit without a summing block by direct electrical connection of the output of the digital-to-analog converter to the output of the sample-and-hold circuit.

20. A method of converting an input analog signal into a digital signal, said method comprising:
operating a circuit in current mode such that said input analog signal is a current signal such that no voltage-to-current converter is needed prior to conversion of said input analog signal into said digital signal;
inputting said input analog signal into a sample-and-hold circuit of a first stage;
generating an analog signal having a current with said sample-and-hold circuit;
generating a digital representation of said analog signal generated by said sample-and-hold circuit with a current-mode analog-to-digital converter;
generating an analog signal representing said digital representation with a digital-to-analog converter;
generating a residue signal that is input into a sample-and-hold circuit of a second stage by subtracting said analog signal generated by said digital-to-analog converter from said analog signal generated by said first stage sample-and-hold circuit without a summing block by direct electrical connection of the output of the digital-to-analog converter to the output of the sample-and-hold circuit; and
amplifying said residue signal before inputting said residue signal into at least one subsequent stage and not amplifying said residue signal before inputting said residue signal into at least one subsequent stage.

21. The method of claim 20, wherein said current-mode analog-to-digital converter comprises a flash analog-to-digital converter.

22. The method of claim 20, further comprising amplifying said analog signal generated by said sample-and-hold circuit.

23. The method of claim 20, further comprising testing components in one of said stages using components from another said stage.

24. A pipelined analog-to-digital converter, comprising:
a plurality of stages, at least one of said stages comprising:
a sample-and-hold circuit configured to output an analog signal having a current; and
a current mode analog-to-digital converter configured to output a digital representation of said analog signal;
a digital-to-analog converter configured to receive said digital representation and output an analog signal representing said digital representation;
two analog-to-digital converters connected to an output of said plurality of stages, each of said two analog-to-digital converters outputting a digital signal having a same number of bits, and further comprising inputs for reference currents to said two analog-to-digital converters such that said two analog-to-digital converters together output a digital signal of greater resolution having more than said same number of bits;
wherein said stages are configured such that said analog signal from said digital-to-analog converter in at least one of said stages is input to said current mode analog-to-digital converter in a subsequent stage without amplification.

* * * * *